United States Patent [19]

Bratt et al.

[11] 4,229,517

[45] Oct. 21, 1980

[54] DOT-ETCHABLE PHOTOPOLYMERIZABLE ELEMENTS

[75] Inventors: Martin D. Bratt, Parsippany; Abraham B. Cohen, Springfield, both of N.J.

[73] Assignee: E. I. Du Pont de Nemours and Company, Wilmington, Del.

[21] Appl. No.: 37,947

[22] Filed: May 10, 1979

Related U.S. Application Data

[60] Continuation-in-part of Ser. No. 802,512, Jun. 1, 1977, abandoned, which is a division of Ser. No. 741,039, Nov. 11, 1976, abandoned, which is a continuation-in-part of Ser. No. 632,726, Nov. 17, 1975, abandoned.

[30] Foreign Application Priority Data

| Nov. 13, 1976 | [DE] | Fed. Rep. of Germany | 2651864 |
| Feb. 17, 1978 | [DE] | Fed. Rep. of Germany | 2660103 |
| Nov. 16, 1976 | [AU] | Australia | 019666/76 |
| Nov. 17, 1976 | [BE] | Belgium | 172416 |
| Nov. 17, 1976 | [BR] | Brazil | PI 7607672 |
| Nov. 17, 1976 | [CA] | Canada | 265899 |
| Nov. 17, 1976 | [FR] | France | 76 034572 |
| Nov. 17, 1976 | [JP] | Japan | 76/139041 |
| Nov. 17, 1976 | [GB] | United Kingdom | 047954/76 |

[51] Int. Cl.³ ............................................. G03C 1/68
[52] U.S. Cl. .................................. 430/271; 430/273; 430/281; 430/285; 430/950; 430/910
[58] Field of Search ................ 96/35.1, 87 R, 115 P; 430/271, 273, 281, 286, 287, 288, 950

[56] References Cited

U.S. PATENT DOCUMENTS

| 3,617,278 | 11/1971 | Jeffers | 96/84 R |
| 3,787,211 | 1/1974 | Volkert et al. | 96/35.1 |
| 3,867,153 | 3/1975 | Maclachan | 96/115 P |
| 3,885,963 | 5/1975 | Monaham | 96/35.1 |
| 3,887,450 | 6/1975 | Gilano et al. | 96/35.1 |
| 3,901,902 | 9/1975 | Kleeberg et al. | 96/35.1 |
| 3,915,824 | 10/1975 | McGinnis | 96/115 P |
| 4,002,478 | 1/1977 | Kokawa et al. | 96/35.1 |
| 4,038,078 | 7/1977 | Sakurai et al. | 96/115 P |

OTHER PUBLICATIONS

Dunham et al., Def. Pub., T900009, Published 7/18/72, pp. 1-6.

*Primary Examiner*—Jack P. Brammer

[57] ABSTRACT

High contrast, dot-etchable solvent-processable lithographic film elements are described comprising a sheet support, a photopolymerizable layer having a thickness of, at most, 0.0004 inch (0.010 mm) and an optical density of at least 3.0 in the actinic region. Images made from these elements may be reduced in area by a process of chemically undercutting the image areas and then spraying or rubbing them. The elements are useful as contact speed lithographic films and for other graphic arts applications.

25 Claims, 6 Drawing Figures

DOT-ETCHABLE PHOTOPOLYMERIZABLE ELEMENTS

CROSS REFERENCE TO RELATED APPLICATIONS

This is a continuation-in-part of application Ser. No. 802,512, filed June 1, 1977, now abandoned, which is a division of application Ser. No. 741,039, filed Nov. 11, 1976, now abandoned which is a continuation-in-part of application Ser. No. 632,726, filed Nov. 17, 1975, now abandoned.

This invention relates to new photopolymerizable elements which can be used for preparing novel, dot-etchable image-containing masks that are useful for copy preparation and related purposes. Masks are used in imagewise exposing other photosensitive elements with actinic radiation.

In the photomechanical trades, a mask containing an image that is opaque to actinic radiation is used in preparing a printing plate of some kind; whether letterpress or lithographic, the method of production is much the same. A metal (or in some cases, plastic) plate is coated with a photosensitive resist-forming material, and is exposed to actinic light through the mask. After exposure, the plate is treated with a solvent that removes the unexposed material, leaving a resist image which protects the resist-covered areas of the metal plate from the acid used in etching the plate (in the case of letterpress) of from the various hydrophilic coatings used in lithography.

For this purpose, the image in the mask must be of the highest possible contrast, e.g., completely opaque black in the image areas, and completely transparent (free from fog) in the unexposed areas. For such masks, a film known as "litho" film (or various proprietary names containing "lith") is used. Such films are usually silver halide emulsions which produce extremely sharp images of high density and contrast; they are used in the graphic arts for making line and screen images, and in some phototype-setting systems. The characteristic curve of a lith film has a steeply rising straight-line portion, and a very short toe.

When a litho film is exposed through a halftone screen and developed, it contains an image comprised of dots. The dots correspond to the areas of the film under the transparent areas of the halftone screen and are comprised of exposed and developed material. In silver halide litho films, these dots may be reduced in size by "dot-etching". Dot-etching is reducing the size of, or "etching" the halftone dots, thereby changing the tone values of the image. In silver halide films, this is done chemically by treating the films with a silver "solvent". This method is used in lithography when tone values or color strength must be changed during the photographic steps rather than on the printing plate. Its importance is further illustrated in the processes for correcting color work.

When process color work is a part of the daily business of a lithographic shop, a certain amount of correction is often necessary to accurately reproduce the colors in the original. A typical procedure requires the production of a set of three or four color separation negatives, and from these negatives, a set of halftone positives is made. Both of these operations are performed by a color cameraman, and at a later stage, the halftone positives are given to the dot-etch artist for correction.

The dot-etcher chemically treats the halftone positive dots to reduce their size in selected areas. At some point, the dot-etcher is satisfied that the work he has done will produce the necessary color correction in the reproduction. He then turns the corrected positive over to someone to make a contact halftone negative from it for platemaking. This step is often performed by the contact printer. At times, if a deep-etch plate is required, the contact printer will first make a contact halftone negative, and then, from this negative, make a contact halftone positive. The reason for this seeming duplication of effort is to get an image with a dot sufficiently optically dense for the platemaking exposure. This type of dot is known as a "hard" dot. The dot-etching process reduces the optical density of silver halide dots and therefore necessitates the extra step to obtain hard dots.

An improved mask suitable for use as a litho film is needed which will produce hard dots and which does not involve the expense and red light handling requirements of silver halide films. Any such mask, however, needs to have the chaaracteristic of dot-etchability so as to perimt tone correction.

Photopolymerizable elements do not normally contain silver which is oxidized in a conventinal dot-etch process. Thin, solvent-processable photopolymerizable elements containing actinic radiation absorbers and colorants are known. However, the thickness of such solvent developable elements and amounts of actinic radiation absorbers or colorants therein are adjusted to transmit sufficient actinic radiation to insure complete polymerization of the layer through to the support thereby insuring good anchorage of image areas thereto. A new type of photopolymerizable element had to be invented to achieve a dot-etching capability in the absence of silver comparable or superior to that achieved with silver halide-containing films.

In accordance with this invention high contrast, dot-etchable solvent-processable film elements are provided which comprise a support bearing a very thin actinic radiation photopolymerizable layer no more than 0.010 mm thick and having an optical density of at least 3.0 to the actinic radiation, the photopolymerizable layer comprised of an ethylenically unsaturated compound capable of forming a high polymer by free radical initiated, chain propagating, addition polymerization, an organic polymeric binder, a free radical generating addition polymerization initiator system activatable by actinic radiation in the spectral region of 300 nm or above, and optionally containing an actinic radiation absorber, the photopolymerizable layer being the outermost layer of the element or being contiguous to a removable cover sheet or an overcoat layer which is at least partially soluble in or permeeable to a solvent for the photopolymerizable layer.

The photopolymerizable layer will ordinarily have a cover sheet or overcoat layer which is transparent to actinic radiation to protect the element against oxygen inhibition as well as physical damage. The invention therefore provides a high contrast, dot-etchable solvent-processable lithographic film element comprising in order, (1) a support, (2) a photopolymerizable layer having a thickness of no more than 0.0004 inch (0.010 mm) and an optical density of at least 3.0 in the actinic region, and (3) a removable cover sheet or overcoat layer which preferably is transparent to actinic radiation. By the term "overcoat layer" as used throughout is meant a coating in dry form over the photopolymerizable layer which is at least partially soluble in or permeable to a solvent for the photopolymerizable layer. A matting agent, e.g., colloidal silica, corn or rice starch particles, or mixtures thereof, etc., can be present in the overcoat layer.

The elements of the invention are used in a process of image reproduction having the steps of (1) imagewise exposing to actinic radiation a photopolymerizable layer on a support, the layer containing actinic radiation absorbing material, (2) removing the unexposed areas of the layer (e.g., by washing out from the side of the layer which was exposed to actinic radiation), leaving an image on the support comprised of the exposed areas of the layer, and (3) reducing the size of exposed image areas by removing the edges of the areas on the side of the layer which was exposed to actinic radiation.

The photopolymerizable elements of the invention can replace the use of expensive silver halide materials for making photographic masks. It has been found that the invention, as defined, provides a photopolymerizable element with a characteristic curve suitable for lithographic applications and which produces images which are tone correctable by dot-etching without significant loss of image density. The elements of the invention are also characterized by rapid processability, suitability for bright light handling, and production of halftone dot images that are sharper and easier to reduce in size than those of silver halide litho films with greatly reduced operator handling. These and other aspects of the improvement in the art provided by the invention are described hereinafter.

IN THE DRAWINGS

FIG. 1 is a schematic (not to scale) cross-sectional view of an exposed and developed element of the invention with exposed areas, whose edges have been undercut by development, remaining on the sheet support.

FIG. 2 is a vertical view of exposed and developed elements showing the pattern of halftone dots composed of exposed, opaque photopolymer. FIG. 2A represents 60% dots, whose corners intersect thereby defining holes. FIG. 2B represents 10% dots.

Figure 1:

The present invention is based on the discovery of the process of "etching" exposed areas (especially, halftone dots) of photopolymerizable material and that photopolymerizable elements usable in this process can be obtained using a photopolymerizable layer which is very thin, i.e., not more than 0.0004 inch (0.010 mm) thick, and contains sufficient actinic radiation absorbing materials such that the optical density of said layer in (i.e., throughout) the actinic region is at least 3.0. Imagewise exposure to actinic radiation, e.g., in the region 300 nm and above, preferably 350 to 400 nm, produces hardened areas in the photopolymerizable layer corresponding to the transparent areas of the stencil or process transparency through which the element is exposed. Development of the elements after exposure is preferably by washout of unexposed areas down to the base with a solvent for the unexposed areas. Continued action of the solvent during development undercuts (i.e., removes material beneath the edges of) the exposed, hardened areas; since the high optical density of the layer causes a gradient in degree of polymerization or hardening through the thickness of the layer, with the greatest degree of polymerization or hardening at the surface of the layer. The remaining image areas consist of a hardened upper skin which rests on a softer undervolume having a lesser degree of polymerization or hardening. The sheet support of the elements supports the exposed areas of the developed mask and in combination with the removable cover sheet or overcoat layer provides protection against oxygen inhibition on exposure.

Photopolymerizable materials are particularly suitable for the layer since they can be washed out with solvent in unexposed areas and undercut easily. Preferred elements of this invention therefore comprise a transparent support, a transparent cover sheet or overcoat layer, and a single photopolymerizable layer, not more than 0.0004 inch (0.010 mm) thick, between the support and cover sheet or overcoat containing:

a. An ethylenically unsaturated compound capable of forming a high polymer by free radical initiated, chain propagating, addition polymerization, 7.5-35% by weight,
b. an organic polymeric binder, 10-75% by weight,
c. a free radical generating addition polymerization initiator system activatable by actinic radiation, 0.1-25% by weight, and
d. an actinic radiation absorbing material, 0-40% by weight, present in such concentration as to impart an optical density to the photopolymerizable layer of at least 3.0 over at least the spectral range of 350 to 400 nm.

Particularly preferred are such elements having a thickness of not more than about 0.0003 inch (~0.008 mm) having an optical density in the photopolymerizable layer of at least 4.0.

In a particularly preferred element of this invention, the polymeric binders are selected so that the unexposed photopolymerizable composition is soluble in predominantly aqueous solutions, e.g., dilute aqueous alkaline solutions, but upon exposure to actinic radiation becomes relatively insoluble therein. Typically, polymers which satisfy these criteria are carboxylated, e.g., vinyl addition polymers containing free carboxylic acid groups. However, a wide variety of binders may be used, as disclosed in prior art photopolymerizable compositions, where aqueous development is not required.

The elements of the invention are versatile in that they can be used as litho masks and as "photomasks". A mask suitable for contact speed lithographic work is readily provided by the above elements by, for example, imagewise exposing the element with a halftone screen through the cover sheet or overcoat layer, followed by peeling off the cover sheet or dissolving the overcoat layer partially or completely, and then developing by washing out the unexposed areas to leave a suitable dot-etchable mask on the support film. Of course, in this application, dyes or pigments, e.g., colloidal carbon, would be added to the photopolymerizable layer so that the image would be opaque in both the ultraviolet and visible regions of the spectrum.

Alternatively, a suitable "photomask" for use in exposing photoresists and the like can be provided by a slightly different process. In this instance, for example, after removing the cover sheet or completely or partially removing the overcoat layer, the photopolymerizable layer on a temporary support can be laminated to a dimensionally stable and rigid support, for example, optical glass. Then, after lamination and exposure, the temporary support is removed and solvent development of the photopolymerizable layer yields the photomask on the rigid support. In this application, the layer may contain dyes or pigments absorbing throughout at least the 350 to 400 nm range. Thus, the photomask can be substantially transparent in at least a portion, e.g., a major portion, of the visible region of the spectrum, but be substantially opaque in the actinic region (i.e., the region of the spectrum used to initiate photopolymerization). For example, the photopolymerizable layer can transmit light in the magenta, cyan or yellow regions of the visible spectrum.

The elements of the invention may be used in the ways described above depending on the process of development. Development can be stopped when holes have been cleaned out down to the base and before there is substantial undercutting. The elements thus developed may be used as a photomask for circuit line images, for example, where no etching is desired. If the coating thickness is too great, undercutting may cause uncontrolled or excessive loss of portions of the image. For use as a litho mask, the element is exposed with a halftone screen and developed. When it is desired to correct tone values in the image, development is carried out further to unercut the halftone dots in the image and permit size reduction of the dots. Where development is carried out to the extent causing undercutting, the layer must be very thin so that dots in highlight areas are not completely removed by the etching process. If the layer is too thick, small dots which comprise a photohardened cap preferably not more than one-third the thickness of the layer resting on a tall column of soluble, unexposed material, are exceedingly fragile and subject to breaking off.

The photopolymerizable layer must have an optical density great enough to produce with a very thin layer an opaque image useful as a mask. Where dot-etching is to be practiced, high optical density is also required to produce a gradient in degree of polymerization.

In photopolymerizable compositions the molecular weight of at least one component of the composition is increased by exposure to actinic radiation, causing a change in the rheological and thermal properties of the exposed areas and rendering the exposed areas relatively less soluble in solvents than the unexposed areas, thereby producing a solvent developable image. Photopolymerizable compositions for use in the invention usually comprise a photoinitiator, an actinic radiation absorber to opacify the element in the actinic region, a polymerizable monomer, and a polymeric binder, as described further below.

(a) The Photoinitiator

The photopolymerizable composition contains an organic, free-radical generating system activatable by actinic radiation, i.e., 300 nm and above, which initiates polymerization of the ethylenically unsaturated compound and does not subsequently terminate the reaction. The free-radical generating system should have at least one component that has an active radiation absorption band with a molar extinction coefficient of at least about 50 within the range of about 300 to 500 nm. "Active radiation absorption band" means a band of radiation which is active to produce the free radicals necessary to initiate the polymerization. The free-radical generating system can comprise one or more compounds which directly furnish free radicals when activated by radiation. It can also comprise a plurality of compounds, one of which yields free radicals after having been caused to do so by a sensitizer which is activated by the radiation.

Photoinitiators which can be utilized in the practice of this invention include aromatic ketones such as benezophenone, Michler's ketone (4,4'-bis(dimthylamino)benzophenone), 4,4'-bis(diethylamino)benzophenone, 4-methoxy-4'-dimethylaminobenzophenone, 2-ethylanthraquinone, phenathraquinone, and other aromatic ketones; benzoin, benzoin ethers such as benzoin methyl ether, benzoin ethyl ether and benzoin phenyl ether, methylbenzoin, ethylbenzoin and other benzoins; and 2,4,5-triarylimidazole dimers such as 2-(o-chlorophenyl)-4,5-diphenylimidazole dimer, 2-(o-chlorophenyl)-4,5-(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, and the like disclosed in U.S. Pat. No. 3,479,185, in British Pat. No. 1,047,569, published Nov. 9, 1966, and U.S. Pat. No. 3,784,557.

Particularly useful initiators are the 2,4,5-triarylimidazole dimers (also known as hexaarylbiimidazoles). These are used with a free-radical producing electron donor agent, such as 2-mercaptobenzoxazole, leuco crystal violet or tris(4-diethylamino-2-methylphenyl)-methane. Such sensitizers as Michler's ketone may be added. Various energy transfer dyes, such as Rose Bengal and Eosin Y, can also be used. Additional examples of suitable initiators are disclosed in U.S. Pat. No. 2,760,863. Other useful systems employ a triarylimidazole dimer and a free-radical producing electron donor agent, with or without the use of a sensitizing compound as described in U.S. Pat. No. 3,479,185. Another useful group of initiators is those mixtures described in U.S. Pat. No. 3,427,161.

The free-radical generating system is employed in a concentration sufficient to initiate polymerization, which is usually about 0.1–25% by weight based on total composition, and preferably about 2 to 20% by weight.

(b) Actinic Radiation Absorber

Compounds, in addition to the photoinitiator system, effective in absorbing actinic radiation, which for most photopolymerizable compositions includes at least the range of 350 to 400 nm, can be present in the layer in relatively high concentrations to provide a very opaque mask and cause a polymerization gradient required for image undercutting. Such a gradient is provided in such compositions by an optical density of at least 3.0 in the layer over at least the spectral range of 350 to 400 nm inclusive. Mixtures of actinic radiation absorbing photoinitiator systems, dyes, and pigments are frequently used to provide the absorption over the visible and actinic range providing an optical density of at least 3.0 throughout it or at least over the range of 300 to 500 nm.

Examples of ultraviolet dyes, ultraviolet absorbors and other dyes which can be used in this invention are listed below:

2,2'-dihydroxy-4-methoxy-benzophenone 4-dodecyloxy-2-hydroxybenzophenone
2,4-dihydroxybenzophenone
hydroxyphenylbenzotriazole
2(2'-hydroxy-5'-methoxyphenyl)benzotriazole
resorcinol-monobenzoate
    2-hydroxy-4-methoxybenzophenone
2,2'-dihydroxy-4,4'-dimethoxy-benzophenone
2,2',4,4'-tetrahydroxybenzophenone
2-hydroxy-4-methoxy-benzophenone-5-sulfonic acid
(also sodium salt of above)
ethyl-2-cyano-3,3-diphenylacrylate
2-ethylhexyl-2-cyano-3,3-diphenylacrylate

| | | |
|---|---|---|
| Luxol ® Orange GRL | Color Index | #25 (Solvent Orange) |
| Luxol ® Orange GS | Color Index | #24 (Solvent Orange) |
| Luxol ® Orange R | Color Index | #20 (Solvent Orange) |
| Plasto ® Orange M | Color Index | #21 (Solvent Orange) |
| Plasto ® Orange RS | Color Index | #22 (Solvent Orange) |
| Grasol ® | | |
| Fast Orange 2RN | Color Index | #33 (Solvent Orange) |
| Oil Orange | Color Index | #12055 (Solvent Yellow #14) |
| Sudan Orange RA | Color Index | #12055 (Solvent Yellow #14) |
| Luxol ® Yellow G | Color Index | #45 (Solvent Yellow) |
| Luxol ® Yellow T | Color Index | #47 (Solvent Yellow) |
| Plasto ® Yellow GR | Color Index | #39 (Solvent Yellow) |
| Plasto ® Yellow MGS | Color Index | #40 (Solvent Yellow) |
| Oil Yellow 3G | Color Index | #29 (Solvent Yellow) |
| Oil Yellow N | Color Index | #2 (Solvent Yellow) |
| Sudan Yellow | Color Index | #30 (Solvent Yellow) |
| Luxol ® Fast Blue AR | Color Index | #37 (Solvent Blue) |
| Luxol ® Fast Black L | Color Index | #17 (Solvent Balck) |
| Primrose Yellow | Color Index | #77603 (Pigment) |
| Chrome Yellow Light | Color Index | #77603 (Pigment) |
| Chrome Yellow Medium | Color Index | #77600 (Pigment) |

Dispersed Manganese dioxide

| | | |
|---|---|---|
| Toluidine Yellow GW | Color Index | #71680 (Pigment) |
| Molybdate Orange | Color Index | #77605 (Pigment) |
| Dalamar Yellow | Color Index | #11741 (Pigment) |
| Green Gold | Color Index | #12775 (Pigment) |
| Graphtol Yellow | Color Index | Pigment Yellow #61 |
| Graphtol Orange | Color Index | Pigment Orange #13 |

Colloidal carbon is a particularly preferred pigment.

To obtain an optical density in a thin layer of at least 3.0 throughout the 350 to 400 nm region frequently requires a high percentage of dyes and/or pigments, usually between 15–40% by weight, of the photopolymerizable layer. When the element of this invention is to serve as a mask for only a limited number of exposures to ultraviolet radiation a high concentration of photoinitiator alone (0% dyes and/or pigments) is sufficient to provide the required optical density. Preferably, however, to provide a mask suitable for many exposures high concentrations of ultraviolet stable dyes and/or pigments are present.

(c) The Monomer

The instant invention is not limited to the use of any particular polymerizable monomer, it being required only that the monomer be ethylenically unsaturated and capable of addition polymerization. A large number of useful monomers is available, generally characterized by one or more terminal ethylenic groups. Among the suitable monomers may be mentioned various vinyl and vinylidene monomers, e.g., vinyl carboxylates, alpha-alkyl acrylates, alpha-substituted acrylic acids and esters thereof, vinyl esters, vinyl hydrocarbons, acrylic and alpha-subsituted acrylic acid esters of the polymethylene glycols and ether alcohols, all as disclosed in U.S. Pat. Nos. 2,760,863 and 2,971,504; the various compounds disclosed in U.S. Pat. No. 2,927,022 and especially those having a plurality of addition-polymerizable ethylenic linkages, particularly when present as terminal linkages, and more especially those wherein at least one and preferably most of such linkages are conjugated with a doubly bonded carbon, including carbon doubly bonded to carbon or to such hetero-atoms as nitrogen, oxygen and sulfur; esters of pentaaerythritrol compounds of the kind disclosed in U.S. Pat. No. 3,261,686; and compounds of the kind described in U.S. Pat. No. 3,380,831; e.g., the reaction product of trimethylolpropane, ethylene oxide, and acrylic and methacrylic acids.

The concentration of the monomer or monomers employed is normally about 7.5–35% by weight based on the total solids of the composition, and preferably between 15–25%.

(d) The Binder

The binder used is an organic polymeric material that is preferably solid at 50° C., and it is necessary that the binder be compatible with the polymerizable monomer and the polymerization initiator system. It may frequently be desirable, but it is not required, that the binder be thermoplastic. The binder may be of the same general type as the polymerizable monomer being used and may be soluble therein and plasticized thereby.

A wide variety of suitable binders, both thermoplastic and nonthermoplastic, is disclosed in U.S. Pat. No. 3,060,023, e.g., cellulose ethers or esters; polyalkylene ethers; condensation polymers of glycols with dibasic acids; polymers and copolymers of vinyl esters; acrylic acids and esters; polyvinyl alcohol; cellulose; phenolic resins; and the like. Other binders, including a number of vinylidene polymers, are disclosed in U.S. Pat. Nos. 2,760,863 and 2,791,504. Still other useful binders are the N-methoxymethyl polyhexamethylene adipamide mixtures of British Pat. No. 826,272, the polyester, polyacetal or mixed polyesteracetal mixtures of U.S. Pat. No. 2,892,716; the fusible polyvinyl alcohol derivatives of U.S. Pat. No. 2,902,365; the fusible blends of selected organic-soluble, base-soluble cellulose derivatives of U.S. Pat. No. 2,902,365; the fusible blends of selected organic-soluble, base-soluble cellulose derivatives of U.S. Pat. No. 2,927,022; the polyvinyl acetals having extralinear vinylidene groups of U.S. Pat. No. 2,902,710; the linear polyamides containing extralinear N-acrylyloxymethyl groups of U.S. Pat. No. 2,972,540; and the 1,3-butadienes of U.S. Pat. No. 3,024,180.

The binder or binder mixture usually comprises between 10–75%, by weight, of the photopolymerizable layer.

Particularly preferred as binders are acidic, polymeric, organic compounds since the photopolymerizable composition resulting is developable in solely aqueous alkaline solvent devoid of organic solvents. This is advantageous since organic solvents are costly, may be hazardous with respect to toxicity and/or flammability, may become scarce due to petrochemical shortages, and may pollute the air and water.

One class of film-forming binders which is soluble in aqueous alkaline media and is useful in the compositions of the present invention is vinyl addition polymers containing free carboxylic acid groups, which are prepared from 30 to 94 mole percent of one or more alkyl acrylates and 70 to 6 mole percent of one or more alpha-beta-ethylenically unsaturated carboxylic acids, and more preferably prepared from 61 to 94 mole percent of two alkyl acrylates and 39 to 6 mole percent of an alpha-beta-ethylenically unsaturated carboxylic acid. Suitable alkyl acrylates for use in preparing these polymeric binders include methyl acrylate, ethyl acrylate, propyl acrylate, butyl acrylate, methyl methacrylate, ethyl methacrylate, butyl methacrylate, etc. Suitable alpha-beta-ethylenically unsaturated carboxylic acids include acrylic acid, methacrylic acid and the like. Binders of this type, including their preparation, are described in German Application, OS 2,320,849, published Nov. 8, 1973.

The advantages of using acidic binders can also be obtained by selecting a preformed, compatible macromolecular polymeric binding agent which is a copolymer of (1) a styrene-type of a vinyl monomer and (2) an unsaturated carboxyl-containing monomer, as described in detail in British Pat. No. 1,361,298.

Another preferred photopolymerizable composition is obtained by using a preformed, compatible macromolecular polymeric binding agent mixture, the components thereof taken from two selected classes. The use of the mixtures as described in British Pat. No. 1,507,704, eliminates the need for organic solvents in developing. These are mixtures of two types of binders. The first type is preferably selected from a copolymer of vinyl acetate and crotonic acid; a terpolymer of ethyl acrylate, methyl methacrylate, and acrylic acid; and cellulose acetate succinate. The second type is preferably selected from toluene sulfonamide formaldehyde; a copolymer of methyl methacrylate and methacrylic acid; a terpolymer of methyl methacrylate, ethyl acrylate, and hydrogen maleate; a terpolymer of vinyl chloride, vinyl acetate, and maleic acid; a copolymer of styrene and maleic anhydride; and a terpolymer of methyl methacrylate, ethyl acrylate, and methacrylic acid.

Photopolymerizable elements can be prepared by coating the photopolymerizable compositions from solvents onto supports in accordance with usual coating practices. Suitable support materials include films composed of high polymers, which are cast as films from molten polymer, such as polyamides, e.g., polyhexamethylene sebacamide, polyhexamethylene adipamide; polyolefins, e.g., polypropylene; polyesters, e.g., polyethylene terephthalate, polyethylene terephthalate/isophthalate; vinyl polymers, e.g., vinyl acetals, vinylidene chloride/vinyl chloride copolymers, polystyrene, polyacrylonitrile; and cellulosics, e.g., cellulose acetate, cellulose acetate/butyrate, cellophane. A particularly preferred support material is polyethylene terephthalate film of the kind described in Alles et al., U.S. Pat. No. 2,627,088, and Alles, U.S. Pat. No. 2,779,684, with or without the surface coating described in the former patent. The support may have a resin "sub" or other layer thereon which may or may not be soluble and which for purposes of this invention is considered part of the support. However, the total thickness of the photopolymerizable layer and any soluble sub or underlayer should not exceed 0.0006 inch (0.015 mm). By "soluble" is meant solubility in a solvent in which the photopolymerizable layer is developable. Preferred soluble sub layers have a thickness not exceeding about 0.0002 inch (0.005 mm). Where the particular application does not require that the base support be transparent, the photopolymerizable composition may usefully be coated on an opaque support, such as paper, espcially water-proof photographic paper; thin metal sheets, especially aluminim and copper sheets, cardboard and the like. The optimum coating thickness for a particular purpose will depend on such factors as the use to which the coating will be put, the particular light-sensitive composition employed, and the nature of other compounds which may be present in the coating. Preferred dry coating thicknesses for the photopolymerizable layer can be from about 0.0001 to about 0.0003 inch (0.0025 to ~0.008 mm).

Even after evaporation of the solvent, many of the photopolymerizable coatings made from the various components outlined above are somewhat soft, sticky, or tacky. To facilitate storage and handling and to protect against oxygen inhibition during exposure, there is applied a removable cover sheet or overcoat layer, which may be either a previously cast film or an additional coating. The cover sheet is a nonphotosensitive sheet that it is completely removable from the entire photopolymerizable layer in one operation, i.e., by stripping. A convenient and suitable material for a cover sheet that can be mechanically stripped off is any of the several commercially available varieties of polyethylene terephthalate or polypropylene film. Alternatively, polymeric materials, e.g., polyvinyl alcohol, gelatin, etc., may be coated in solution over the photopolymerization stratum to leave, after removal of solvent, a dry overcoat layer, which depending on its composition, is at least partially soluble in or permeable to the solvent for the photopolymerizable layer. Some overcoat layers are described in U.S. Pat. No. 3,458,311.

In practicing an embodiment of the invention, an element containing an image-yielding photopolymerizable stratum is made by coating a layer of a photopolymerizable composition disclosed herein on a suitable film support. After drying the photopolymerizable stratum, there is laminated to the surface thereof a removable cover sheet or coated thereon an overcoat layer. The photopolymerizable composition is preferably coated to give a dry coating thickness of about 0.0002 inch (50 mg/dm$^2$) (0.0051 mm). A suitable support film may be chosen from a wide variety of films composed of high polymers, e.g., polyamides, polyolefins, polyesters, vinyl polymers, and cellulose esters and may have a thickness of from 0.00025 inch (0.006 mm) to 0.008 inch (0.203 mm) or more. If exposure is to be through the support and before removing the support film, it must, of course, transmit a substantial fraction of the actinic radiation incident upon it. If the support film is removed prior to exposure, no such restrictions apply. If the support is to remain on the layer, as in the case of a litho mask, it must be transparent. A particularly suitable film is a transparent polyethylene terephthalate film having a thickness of about 0.004 inch (0.102 mm). Suitable removable cover sheets may be chosen from the same group of high polymer films described above and can have the same wide range of thicknesses. Where exposure is to be through the cover sheet or layer, the same should be transparent to actinic radiation. A cover sheet of 0.0005 inch thick (0.013 mm) polyethylene terephthalate is especially suitable. Support and cover films as described above provide good protection to the photopolymerizable layer. The overcoat layers have also been described above. The support and/or the cover film may have other layers thereon as desired, e.g., a silver halide emulsion layer.

Preferred photopolymerizable layers have a thickness of less than 0.0004 inch, e.g., about 0.0003 inch (~0.008 mm). Thicknesses of 0.0002 inch (0.0051 mm) to about 0.0003 inch (18 0.008 mm) are particularly preferred. The optical density of the layer, which is the result of the light absorbance of the radiation absorber, the photoinitiating system, and all other materials in the layer, is at least 3.0 and preferably at least 4.0. A layer having an optical density of 3.0 in the actinic region absorbs 99.9% of the incident actinic radiation, while a layer with an optical density of 4.0 absorbs 99.99%.

In carrying out the process of this invention, a photopolymerizable element is prepared as already described. The element is then exposed to actinic radiation, preferably through the transparent cover sheet or overcoat layer. The exposure may be by means of a light source which is rich in ultraviolet radiation through a halftone image transparency, e.g., process negative or positive (an image-bearing transparency consisting solely of substantially opaque and substantially transparent areas where the opaque areas are substantially of the same optical density). The transparency may also have a line image such as engineering drawings. The image or transparency may or may not be in contact with the surface of the element, i.e., contact exposure or projection exposure. For exposures through transparent film supports the time required will range from a few seconds to several minutes depending on the intensity of the exposing radiation and the inherent photographic speed of the composition. After exposure, the cover sheet or sheet support through which the element was exposed is removed, and the exposed layer with its exposed, hardened areas and its unexposed or underexposed, unhardened areas is developed by removal of the latter from the element. The removal of the unexposed areas may be accomplished by treating the side of the element which was exposed with the developer solution, thereby washing out the unexposed areas. Alternatively, if an overcoat layer is present instead of a cover sheet, the developer for the unexposed photopolymerizable layer will remove the overcoat layer completely above the unexposed areas and at least partially above the exposed areas.

Since free-radical generating initiators activatable by actinic radiation generally exhibit their maximum sensitivity in the ultraviolet range, the radiation source should usually furnish an effective amount of this radiation. Both point and broad radiation sources are effective. Such sources include carbon arcs, xenon arcs, mercury vapor arcs, fluorescent lamps with ultraviolet radiation emitting phosphors, argon glow lamps, electronic flash units and photographic flood lamps. Of these, the tungsten 1000-watt quartz iodide lamp is most suitable. The sunlamp mercury-vapor arcs are customarily used at a distance of 3.8–61 cm from the photopolymerizable layer. The point sources are generally used at a distance of 50–125 cm from the element. It is noted, however, that in certain circumstances it may be advantageous to expose with visible light, using a photoinitiator sensitive in the visible region of the spectrum. In such cases, the radiation source should furnish an effective amount of visible radiation. Many of the radiation sources listed above furnish the required amount of visible light.

After exposure, the element is developed, e.g., by washing out with a suitable solvent the unexposed, unhardened, soluble portions of the photopolymerizable layer on the side of the layer that was exposed. This may be carried out by impingement of spray jets, with agitated immersion, brushing or scrubbing, to leave the desired colored, hardened, insoluble image. The result is a resist image which has sufficient opacity in the actinic region to be used as an intermediate element, "master", or mask for further exposing photosensitive compositions. The resist image may be used as a mask directly, or it may be subjected to "etching", which is the chemical undercutting and subsequent removal of the edges of the image areas. When the image areas are in the form of dots, this process is referred to as "dot-etching".

The developer solvent is a fluid in which the unexposed areas are sufficiently soluble to be removed from the support and in which the exposed areas are relatively insoluble. The developer solvent selected therefore depends upon the photopolymerizable composition. Thus, the solvent used in coating the composition can be used. Weakly acidic photopolymerizable compositions may be conveniently developed with solvent mixtures as disclosed in U.S. Pat. No. 3,475,171. The more preferred aqueously developable photopolymerizable compositions are developed with aqueous bases, i.e., aqueous solutions of water-soluble bases in concentrations generally in the range from 0.01% to 10% by weight.

Suitable bases for the development include the alkali metal hydroxides, e.g., lithium, sodium and potassium hydroxide; the base-reacting alkali metal salts of weak acids, e.g., lithium, sodium, and potassium carbonates and bicarbonates; ammonium hydroxide and tetrasubstituted ammonium hydroxides, e.g., tetramethyl-, tetraethyl-, trimethylbenzyl-, and trimethylphenylammonium hydroxides, sulfonium hydroxides, e.g., trimethyl-, diethylmethyl-, dimethylbenzyl-sulfonium hydroxides, and the basic soluble salts thereof, e.g., the carbonates, bicarbonates and sulfides; alkali metal phosphates and pyrophosphates, e.g., sodium and potassium triphosphates and sodium and potassium pyrophosphates; tetra-substituted (preferably wholly alkyl) phosphonium, arsonium, and stibonium hydroxide, e.g., tetramethylphosphonium hydroxide.

The same solvents would also be useful in the dot-etch process, wherein the partially hardened dot is undercut and then reduced in size by mechanical abrasion.

The elements of the invention provide a cost saving alternative to silver halide masks. A black, machine processable, contact-speed, photopolymer litho film has been prepared according to the invention with properties equivalent or superior to competitive silver halide films. For example, a 30-second, contact, tungsten lamp exposure gives image reproduction equal to that of a silver halide litho film. The above exposure is sufficient to reproduce a 150 line/inch (59.05 line/cm), 2–98% dot tonal range. Transmission density of background areas is comparable to silver halide (0.05 using blue filter) and good developer latitude, dot-sharpening, and dot-etching have been demonstrated for the preferred element; this element comprises a 0.0005 inch (0.0125 mm) thich cover sheet of polyethylene terephthalate, a 0.0003 inch (0.0076 mm) thick photopolymerizable layer with an optical density of 4.0 in 350 to 400 nm region, containing colloidal carbon, coated on a 0.004 inch (0.102 mm) thick polyethylene terephthalate film substrate, which contains a 0.00002 inch (0.0005 mm) thick soluble subbing. Further, this element can be developed in a low cost, automatic processor which consists of an immersion development compartment and a water spray wash section. At the end of the process the film is dried. The whole process requires less than one minute. Finally, soft dot reproduction with the photopolymer film is either equal to or better than that of silver halide.

A related product may be prepared which is particularly useful in visual registration. This product is a colored, visible light-transparent, ultraviolet-opaque, photopolymerizable element which does not require a dark room, can accurately reproduce 2–98% dots, 150 lines/inch screen (59.05 line/cm), is dot-etchable, and has good exposure and development latitude.

The photopolymerizable elements of the invention completely displace the use of silver in litho films thereby providing great cost and handling advantages. In addition, the elements have improved resistance to scratching and abrasive markings which ruin masks of the silver type. Advantageously, dyes and colorants added to the layer can be controlled to attain just the optical density needed for further copy preparation. When it is necessary for the technician to use more than one mask to make a copy, the transparent image type is clearly visible under safelights used during exposure, resulting in perfect registry. An important commercial advantage is that the use of applicants' elements and processes requires less handling of the photopolymerizable elements in making masks and that they are dot-etchable.

The etching process may be carried out by continuing development until substantial undercutting of exposed areas has occurred and then reducing the size of the exposed areas by removing material from the edges of their upper surfaces (i.e., the surfaces that were exposed to actinic radiation).

In making masks for exposing litho plates, an exposed and developed mask is usually made and then examined by a color proofer who determines whether tone correction is required. This can be done by actually making a litho plate (a "press proof"), by measuring the halftone dots with a densitometer and comparing the colors in the original to color chips keyed to dot size, by a special color proofing film (as described in U.S. Pat. No. 3,649,268), or by any other suitable method of color proofing. If it is determined that tone correction is desired, the mask can be dot-etched by returning it to the developer apparatus which is equipped with spray nozzles or other means to provide the mechanical action for dot-etching. The amount of dot-etching will be proportional to the amount of time in the developer apparatus, so that the process of tone correction by dot-etching can be quite easily controlled. Instead of returning the mask used for proofing to the developer, a new mask can be prepared and simply developed for a longer period of time, so as to yield a dot-etched mask of proper tonal balance. With either alternative, the process usually involves a size reduction in the dots of at least 5% between the mask used for proofing and the subsequently dot-etched mask. More commonly, a size reduction of 10% or more is carried out with the dot-etch process. As illustrated in the examples, a dot-size reduction of 75% or more may be achieved with elements of the invention.

It it is determined that only a portion of the image on the mask needs tonal correction, developer solvent may be applied to that area alone, followed by rubbing with a wet pad or spraying to dot-etch that area selectively.

Figure 2A:
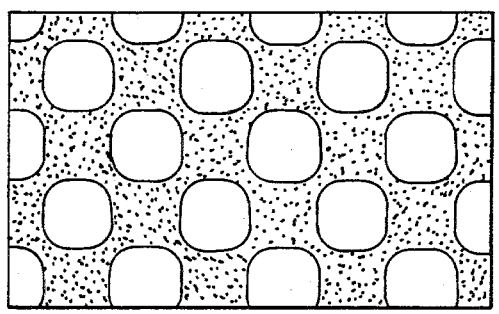
Figure 2B:
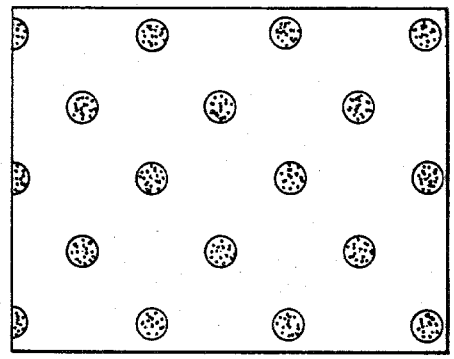
Figure 3:
FIG. 3 is a schematic cross-sectional view of an exposed and developed element of the invention with exposed areas whose undercut edges have been removed.
Figure 4A:
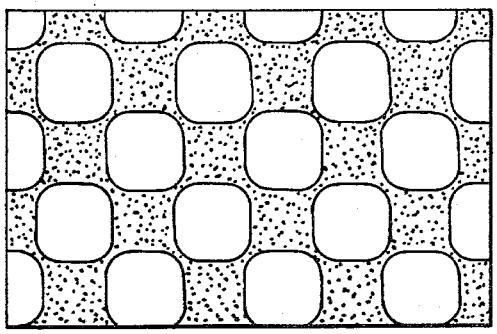
FIG. 4 is a vertical view of exposed and developed elements of FIG. 2 with undercut edges removed showing the reduced size of the halftone dots of the exposed photopolymer image.
Figure 4B:
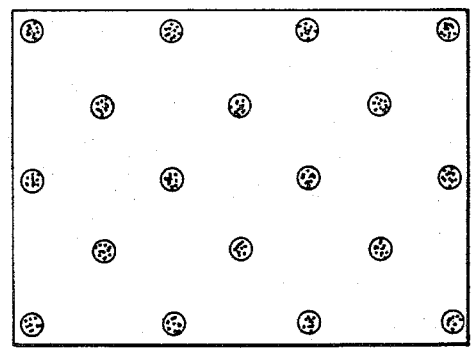

When an element of the invention is exposed with a halftone screen and then developed, the image thereon is comprised of normally square halftone dots of polymeric material. It will be noted that square dots of a size of 50% or greater touch at the corners and thereby define clear "holes" in the mask. Dot-etching of such large dots therefore may be viewed as hole enlargement; however, hole enlargement occurs through reduction in size of the exposed, polymeric dots. In all cases dot-etching results in less opaque polymeric exposed area on the mask and therefore a reduction in the overall density of the image due to larger spaces between the opaque polymeric exposed areas. The drawings illustrate the effect of dot-etching on large and small size dots. FIG. 1 represents a dot image that has been undercut but not subjected to physical abrasion to reduce dot size. FIG. 2A shows 60% dots before dot-etching, and 2B shows 10% dots before dot-etching. FIG. 3 represents a dot image that has been dot-etched. The upper surfaces of the dots have been broken off, thereby reducing dot size. FIG. 4A shows the dot image of FIG. 2A after dot-etching. The dots have been reduced in size by physical abrasion, thereby enlarging the holes between them. FIG. 4B shows the dots of FIG. 2B after dot-etching which has reduced their size.

The invention accordingly provides a process comprising the steps of imagewise exposing the element, removing the unexposed areas of the photopolymerizable layer, and reducing the size of exposed image areas by removing the edges of said areas. The latter two steps can be carried out sequentially in a single pass through a developer apparatus suitably equipped with spary, brushing, or other means to apply mechanical action to the dot surface. Alternatively, these steps may be carried out by hand, as by immersion in developer and rubbing. The first step of the process, imagewise exposing, especially through a halftone screen, thus produces a dot-etchable mask from an element of the invention. The mask contains a tone correctable image comprised of opaque polymeric dots which are reducible in size by mechanical action (e.g., rubbing, brushing, or spraying) on the image bearing surface of the mask. Such a mask before and after size reduction by mechanical action is represented by FIG. 1 and 3, respectively.

As explained above, the major utility of dot-etching is in lithographic plate making, wherein a mask of the invention is one of a plurality of color separation masks and reducing the size of the exposed areas (dots) is carried out to an extent whereby a composite color image produced with the masks (on a lithographic plate or on a proofing film) has the same tonal balance as the original color image. The elements of the invention are capable of functioning in this process, thereby providing a new and improved replacement for silver halide litho masks.

The elements of this invention are also useful as color-coded photomasks. Such masks can be used to expose photosensitive printing plates which will print yellow, magenta, cyan process colors, and usually also black, thus forming a full-color reproduction of the original. The masks themselves are colored in these shades and thus provide a simple, rapid method for proofing.

Color-coded photomasks meet the optical density and thickness requirements set forth above, i.e., have an optical density throughout the actinic region of at least 3.0 and a thickness no greater than 0.010 mm. The high optical density is achieved by adding relatively high concentrations of ultraviolet absorbers to the photopolymerizable layer. Each layer is also colored in a visible region of the spectrum with transparent dyes or pigments corresponding with inks to be later used; generally yellow, magenta, cyan and black.

In use, a printer desiring to prepare full-color prints of a process transparency, would expose the yellow photomask of this invention to a halftone image of the yellow component of the process transparency, the magenta photomask to the magenta component, the cyan photomask to the cyan component, and, usually, a black photomask to the gray-to-black component. After exposure and development, the imaged masks would be assembled, one on top of the other in register, to yield a full color proof of the original, e.g., when viewed with transmitted light. If the color reproduction was satisfactory, each imaged photomask would be used for exposing a positive-working photosensitive printing plate, which when processed and linked with an ink corresponding in color to the color of the photomask, would yield prints of that color. Multiple printing from plates exposed through each of the yellow, magenta, cyan, and black imaged masks, and inked accordingly, would yield a faithfully reproduced full-color print of the original process transparency.

At other times, when the color-coded imaged photomasks havr been assembled for proofing, it may be observed that the full color proof is, for example, too yellow, or too red, etc., either overall or in certain regions. In this instance, the imaged photomask corresponding to the excess color would be corrected by dot-etching, either overall or locally. After dot-etching, the color-coded imaged photomasks would be reassembled and inspected again. Further corrections may be necessary, and they would be made until the assembled color-coded masks gave the full-color reproduction desired. When satisfactory, each mask would then be used to expose a photosensitive printing plate.

The color-coded photomasks of this invention, when assembled in register, provide a very convenient proofing system. The above description applies only to positive-working photosensitive printing plates. When negative-working plates are to be exposed, an extra process step is involved. Each color-coded mask is used to prepare a contact lithographic negative film, which is then used for modulating exposure of the printing plate.

The following examples illustrate embodiments of the invention in which a photopolymerizable composition, comprising a polymerizable monomer and a polymeric binder is used for the photopolymerizable layer. Such compositions have been found to work particularly well in the invention, possibly due to migration of the monomer through the binder toward the radiation source, resulting in a high gradient of polymerization through the thickness of the layer and thereby promotion of dot-etchability. Such compositions are therefore particularly preferred.

The developed images of the examples of the invention had high density in the image areas and little or no density in the nonimage areas. The lack of density in the nonimage areas (background) provides an important advantage over diazotype masks, which have substantial background density. This advantage is facilitated by the use of a soluble sub layer. Elements of the invention can be provided which are capable of having an optical density to radiation in the 350 to 400 nm region in the nonimage areas after development not exceeding 0.3 and preferably being virtually nil. Such elements containing a dispersed pigment, e.g., carbon black, as the radiation absorber are particularly preferred since they can provide elements with very good photospeed.

In carrying out the process of this invention, exposures sufficient to polymerize the surface, but not more than about one-third the photopolymerizable layer, are preferred with the time of exposure not exceeding about 3 minutes.

The invention will be further illustrated by the following examples, wherein parts and percentages are by weight unless otherwise noted.

EXAMPLE 1

A coating composition was prepared from solvent solutions of the following ingredients:

| Component | Amount (grams) | % Solids* |
| --- | --- | --- |
| (a) Methylene chloride solvent | 433.7 | 0 |
| (b) Methanol solvent | 47.3 | 0 |
| (c) Copolymer of methyl methacrylate (90 mole %) and methacrylic acid (10 mole %), mol. wt. range about 30,000–50,000 | 49.7 | 40.17 |
| (d) Polymethylmethacrylate, high mol. wt., 0.9 inherent viscosity | 2.6 | 2.11 |
| (e) 2,2'-Bis(2-chlorophenyl)-4-4',5,5'-tetraphenyl biimidazole | 8.2 | 6.60 |
| (f) 4,4'-Bis(dimethylamino)-benzophenone (Michler's ketone) | 3.2 | 2.58 |
| (g) Mixed ester of triethylene glycol-dicaproate and di-acrylate, refractive index 1.4460 at 25° C. | 1.8 | 1.42 |
| (h) Trimethylol propane triacrylate | 33.3 | 26.97 |
| (i) 2-Mercaptobenzothiazole | 1.2 | 0.96 |
| (j) Grasol ® Fast Orange 2RN, C.I. Solvent Orange 33 (a mixture of Solvent Red 30, C.I. 27291 and dicyclohexylamine salts of a bisazodisulfo acid dye). | 23.7 | 19.19 |

*in the coating composition

After thorough mixing, a portion of the photopolymerizable composition thus formed was coated on the sub layer of a 0.007 inch thick (0.178 mm) polyethylene terephthalate clear film support, prepared as described in Example IV of assignee's Alles U.S. Pat. No. 2,779,684, containing an insoluble resin sub layer on one side only. After hot air drying, the dry photopolymerizable layer was about 0.0003 inch (0.0076 mm) thick and had an optical density of 4 over the spectral range 300 to 500 nm, as measured on a Cary recording spectrophotometer. The resulting product was laminated with a 0.0005 inch thick (0.0127 mm) clear, biaxially oriented and heat-set polyethylene terephthalate film removable cover sheet to yield a composite element. This element was then imagewise exposed for 15 seconds, through the cover sheet side, by a fluorescent, black light source rich in ultraviolet radiation, in a standard (nuArc ®) vacuum frame with a silver image transparency bearing an opaque image simulating a printed circuit. The radiation source contained 9 closely-packed, 24-watt, high output bulbs (General Electric Corp., F24T 12-BL-HO); this source was placed 3 inches (7.62 cm) from the photopolymerizable element. After exposure the cover sheet was stripped off and the layer developed, by washing out the unexposed, unpolymerized portions of the coating, using a predominantly aqueous solution of a solvent for the unexposed material of the layer of the following composition:

|  | Grams |
| --- | --- |
| Sodium carbonate monohydrate | 35.0 |
| Diethylene glycol monobutyl ether | 226.5 |
| Distilled water | 3290.0 |

After developing with the above solution, rinsing with water, and air drying, the resulting film contained an orange, polymeric, ultraviolet-absorbing image which was transparent to visible light but had an optical density of 4 or over the spectral range 300 to 500 nm. This imaged element, an exact replica of the silver image transparency original, was useful as a target, stencil, or mask, for preparing printed circuits using the process and materials described in U.S. Pat. No. 3,469,982.

Another composite element made as previously described was given a 30 second exposure to the compact black light source above through a 150 line halftone screen hard dot target through the cover sheet side. After removing the cover sheet, the unexposed areas were washed away by immersing the element in the developer described above at 73°–74° F. (23° C.) for 90 seconds, immersing the element in water to stop development and then rubbing the element with a developer-laden pad to dot-etch and eliminate residual unexposed material. Transmission density of background areas is comparable to silver halide films (0.05 using a blue filter). The process produced an image on the film support comprised of polymeric dots reduced in size from the size corresponding to the halftone screen values. Alternatively, the element could have been developed in an apparatus having scrubbing members.

The use of a weak developer improves developer latitude, i.e., the amount by which the time of development can be varied without significant effect. Immersion in water quickly stops the action of the developer and minimizes the requirement for a wide developer latitude. After immersion in water the element can be rubbed with a water-wet pad to remove material which, although not dissolved, remains loose on the element.

Another composite element made as previously described was dot-etched by the following procedure. The etching solution used was similar to developer with the addition of a surfactant, octyl phenoxy polyethoxy ethanol (Triton ® X-100), and a thickener (cellulose gum). The test sample was first immersed in etching solution for 10 seconds and taken out and allowed to stand (on horizontal surface) for a variable amount of time, after which it was immersed in water and then rubbed with a developer laden pad. Total etch time vs. dot equivalency is given below:

| ETCH TIME - DOT EQUIVALENCY | |
| --- | --- |
| (Immersion + Standing Time) Seconds | (Dot Equivalency) |
| 0 | 92 |
| 20 | 84 |
| 40 | 73 |
| 80 | 63 |
| 120 | 54 |

Microdensitomer Measurements

Measurements were taken in 2 etched areas of the tonal range. The first was a 90% test area reduced to a 60% dot equivalency. This area is characterized by mostly solid background with circular clear holes dispersed in a regular pattern. Etching produced larger holes which remain circular. The other area, which is characteristic of the low tonal range up to 50% dot equivalency, is comprised of a regular pattern of dots. Results of microdensitometer scans are given below:

| Original Dot Equivalency | 90 | 45 |
| --- | --- | --- |
| Element | hole | dot |
| Etched-Dot Equivalency | 60 | 10 |
| Etch Time (sec.) | 100 | 60 |
| % Density loss in element | 6 | 20 |

This illustrates that the value of the tones can be drastically altered without seriously affecting top density.

150 (59.05) Line Halftones Reproduction

Dot equivalencies of the developed test sample before etching in the 5–93% region of the tonal range are shown below:

| Original Silver Halide Hard Dot Target % Dot* | Photopolymer Reproduction % Dot |
| --- | --- |
| 5 | 5 |
| 10 | 9 |
| 23 | 21 |
| 34 | 33 |
| 43 | 41 |
| 54 | 55 |
| 65 | 65 |
| 77 | 76 |
| 83 | 84 |
| 93 | 95 |

*Since the photopolymer system is negative working, these number represent the anticipated values to be obtained from this original.

These data show that the extremes of the tone range (5 to 93%) were reproduced simultaneously.

Exposure Latitude

The following data compare exposure latitude of photopolymer test samples prepared and developed as above, without etching vs. a silver halide contact litho mask. A test target was exposed at various exposure times and four target areas were measured to determine dot equivalency.

| Exposure (seconds) | Photopolymer Mask Dot Size | | | | |
| --- | --- | --- | --- | --- | --- |
| 5 | 6 | 29 | 41 | | 91 |
| 10 | 9 | 34 | 48 | | 94 |
| 20 | 9 | 35 | 50 | A | 96 |
| 40 | 9 | 39 | 54 | | 97 |
| 80 | 9 | 39 | 68 | | 98 |
| Exposure (seconds) | Silver Halide Mask Dot Size | | | | |
| 5 | (top density too low at this exposure) | | | | |
| 10 | 7 | 33 | 53 | | 93 |
| 20 | 7 | 34 | 54 | B | 94 |
| 40 | 7 | 37 | 59 | | 96 |
| 80 | 7 | 40 | 63 | | 97 |
| 160 | 9 | 44 | 72 | | 99+ |

The most critical area in both cases is on the 50% dot size range where a 12% variation is noted from 10–40 seconds (A & B), indicating equivalent exposure latitude for the photopolymer mask and the silver halide mask. It is therefore demonstrated that the elements of the invention, which contain no silver halide, have equivalent sensitometry for contact litho mask applications to silver halide masks of the prior art.

EXAMPLE 2

This example shows various applications of the elements of the invention as masks. A coating composition identical to that described in the preceding example was prepared but containing, in addition, 42.5 g of Basic Blue 7 (C.I. 42595). Using the element preparation procedure, exposure device, and development process detailed in Example 1, a photographic, silver halide negative test image was used as target during exposure. The resultant black, polymeric, positive image, having a thickness of 0.0003 inch (0.0076 mm) and absorbing with optical density greater than 3.0 in the range 300 to 500 nm, was used as a mask in exposing the following light-sensitive materials:

1. A photopolymer printing plate described in U.S. Pat. No. 3,458,311 was exposed through this mask for 45 seconds at 36 inches (91.4 cm) under a carbon arc. The line and halftone pattern was developed with the developer composition disclosed in the above reference and a suitable printing plate was obtained.

2. A "tacky" photopolymer system as described in U.S. Pat. No. 3,649,268 was prepared and coated to a dry thickness of 0.0004 inch (0.01 mm) on resin subbed polyethylene terephthalate and overcoated by laminating a 0.0075 inch thick (0.019 mm) polyethylene terephthalate sheet on top. Exposure was carried out with a xenon arc for 15 seconds at 18 inches (45.7 cm). The image, which is formed by the hardening of the tacky polymer in the area which was exposed, was developed after removal of the polyethylene terephthalate cover sheet by dusting in the conventional manner with a dry, colored dye which adhered to those tacky portions. This material is described in Heiart, U.S. Pat. No. 3,307,943. The resultant dyed imaged was transferred to coated paper stock by lamination of 110° C. and an excellent positive copy of the photomask was thus secured.

3. A moderately slow, ortho-sensitive silver halide film was exposed for 10 second with the photopolymer mask using a General Electric 100-watt, 20-volt standard incandescent lamp at a distance of 53 inches (135 cm) through a 0.6 neutral density filter and a No. 47 Wratten® filter. The image was developed in a standard multiprocess type developer (metol-hydroquinone) followed by fixing in a conventional photographic fixer, washed and dried as known to those skilled in the art. A very high resolution black and white image was obtained.

EXAMPLE 3

A black photopolymerizable layer, similar to Example 1, was prepared containing the following ingredients:

| Component (of Example 1) | Percent |
| --- | --- |
| Binder (c) | 38.20 |
| Photoinitiator (e) | 5.92 |
| Photoinitiator (f) | 2.34 |
| Plasticizer (g) | 1.30 |
| Monomer (h) | 24.50 |
| Chain transfer agent (i) | 0.87 |
| Orange dye (j) | 13.10 |
| Luxol® Fast Black L (C.I. Solvent Black 17) | 13.8 |

The above materials were dissolved in methylene chloride/2-ethoxyethanol (7:3 ratio by volume) to yield a coating solution containing 20% solids. This solution was coated on a polymeric film support at a coating weight of 95–100 mg/dm² to yield a dried, photopolymerizable layer with a thickness of 0.0004 inch (0.01 mm) and an optical density greater than 3.0.

The 0.004 inch (0.10 mm) thick polyethylene terephthalate film support, in this Example, had a 0.0002 inch (0.005 mm) thick soluble substratum which was a modification of that disclosed in Rawlins, U.S. Pat. No. 3,443,950. This modification consisted essentially of adding two acidic terpolymers in a weight ratio of approximately 1.2:8.01:1 (Rawlins sub:first polymer:second polymer) wherein the first polymer is formed from ethyl acrylate (56%), methyl methacrylate (37%) and acrylic acid (7%), and the second polymer is formed from 66% methyl methacrylate, 29% ethyl acrylate, and 5% methacrylic acid, to the substratum described in the above cited patent.

After completing the element preparation, by laminating the cover sheet of Example 1 following the process of Example 1, the element was exposed through hard and soft dot targets. Exposure was carried out for 30 seconds with a 2500-watt, pulsed xenon nuArc® (Model FT26M-2) radiation source at a distance of 43.2 cm. Then, after removing the cover sheet, the black image was developed. The developer of Example 1 was found to perform well with a 30 second immersion at 80° F. (27° C.). An automatic processor is used which has a development and a wash stop stage. After being submerged in a developer section, the film is transported through a water spray which not only removes developed matrix but dilutes residual developer and stops its action; the element is then dried. Immersion step takes 30 seconds and second stage takes an equal amount of time. Good hard and soft dot reproduction was obtained. The mask image could be dot-etched if desired.

EXAMPLE 4

A useful, black, solely aqueous alkaline developable, photopolymerizable composition was prepared containing the following ingredients:

| | Component | Amount (grams) |
| --- | --- | --- |
| (a) | Solvent (a) of Example 1 | 720.0 |
| (b) | Solvent (b) of Example 1 | 80.0 |
| (c) | Terpolymer formed from 56% ethyl acrylate, 37% methyl methacrylate and 7% acrylic acid, mol. wt. ca. 260,000, acid number 76-85. | 15.2 |
| (d) | 1:1 copolymer of styrene and maleic anhydride, partially esterified with isopropyl alcohol, mol. wt. ca. 1700, acid number ca. 270 | 25.1 |
| (e) | Photoinitiator (e) of Example 1 | 5.3 |

-continued

| | Component | Amount (grams) |
|---|---|---|
| (f) | Photoinitiator (f) of Example 1 | 2.1 |
| (g) | Chain transfer agent (i) of Example 1 | 0.8 |
| (h) | Triethylene glycol dimethacrylate | 12.0 |
| (i) | Dye (j) of Example 1 | 20.0 |
| (j) | Blue dye of Example 2 (C.I. 42595) | 4.0 |
| (k) | Nonionic fluorocarbon surfactant FC-430, Minn. Mining and Mfg. Corp., 10% solution in CH$_2$Cl$_2$ | 0.3 |

This coating solution was coated by the use of a so-called "doctor" knife, to yield a dry 0.0003 inch (0.0076 mm) thick layer having an optical density greater than 3.0 in the 300 to 500 nm region, onto the substrate and subbing layer described in Example 3. Element preparation was completed by lamination, at 75° C., as described in Example 1. The finished product was given a 1 minute exposure, through a halftone target, using an xenon lamp (nuArc ® "Flip-Top" Plate Maker Model FT26M-2). Development (15 seconds) with a 4% aqueous sodium carbonate solution at 80° F. (27° C.) gave an exact positive copy of the original which was useful for preparing other copies.

EXAMPLE 5

This example illustrates a different initiator system and preparing a photomask on glass:

| Component | Amount (grams) | % Solids |
|---|---|---|
| Methanol | 160.0 | |
| Methylene chloride | 6928.0 | |
| Poly(methyl methacrylate) mol. wt. ca. 30,000 | 351.6 | 22.60 |
| Poly(methyl methacrylate) mol. wt. ca. 100,000 | 233.3 | 14.99 |
| Copolymer of methyl methacrylate and gamma-methacryloxypropyl-trimethoxy silane, see U.S. Pat. No. 3,758,306 | 58.7 | 3.77 |
| Photoinitiator (f) of Example 1 | 2.42 | 0.0156 |
| Benzophenone | 11.2 | 0.72 |
| Triethylene glycol diacetate | 98.5 | 6.33 |
| Monomer (h) of Example 1 | 410.0 | 26.35 |
| Dye (j) of Example 1 | 389.0 | 25.0 |

This solution contained about 13.7% solids and was doctor knife coated on 0.001 inch thick (0.025 mm) clear, biaxially oriented and heat set polyethylene terephthalate film. After drying, the film was laminated with 0.001 inch thick (0.025 mm) polyethylene to protect the resulting UV-absorbing layer which had a dried thickness of about 0.0003 inch (0.0076 mm).

This UV-absorbing layer having an optical density greater than 3.0 in the 300-500 nm region was next transferred to a 3"×4" (7.6×10.2 cm) projector slide cover glass, which had been thoroughly cleaned by scrubbing with solvents. Transfer was accomplished by removing the polyethylene cover sheet and laminating the UV layer to the glass plate through heated rollers at 100°-120° C. at approximately 183 cm/min.

The photopolymerizable layer was then given a 10 second exposure at 40.6 cm with a 1000-watt quartz iodide lamp through a negative containing a standard test pattern comprised of simulated electronic printed circuitry. The polyethylene terephthalate sheet was removed by stripping, and the resulting image developed by spraying 10 seconds with methyl chloroform, followed by a water spray, and the resulting orange image dried by blowing with compressed air. The solvent used herein dissolved the unhardened areas of the photoresist, leaving a suitable, positive mask on a rigid glass support useful for imaging photoresists with light sensitivity of between 300 to 500 nm.

EXAMPLE 6

An orange photopolymerizable composition, similar to Example 4, but containing an oxygen impermeable cover layer, was prepared containing the following ingredients:

| Component of Example 4 | Amount (grams) | % Solids |
|---|---|---|
| Solvent (a) | 363.0 | 0 |
| Solvent (b) | 41.4 | 0 |
| Binder (c) | 15.8 | 17.96 |
| Binder (d) | 26.2 | 29.69 |
| Photoinitiator (e) | 5.5 | 6.21 |
| Photoinitiator (f) | 2.2 | 2.46 |
| Chain transfer agent (g) | 0.83 | 0.94 |
| Monomer (h) | 12.6 | 14.30 |
| Dye (i) | 25.0 | 28.36 |
| Surfactant (k) | 0.7 | 0.08 |

The above coating solution was coated on the substrate described in Example 3, to give a dried coating weight of 80–90 mg/dm$^2$ with a thickness of about 0.0003 inch (0.0076 mm). An oxygen barrier layer, which had previously been coated on the cover sheet described in Example 1, was then laminated over the above photosensitive layer. The barrier composition, dry coating weight 6–10 mg/dm$^2$, was a modification of an aqueous-alcoholic solution of polyvinyl alcohol (medium viscosity, 99% saponified) containing 2% of a polyoxyethylene surfactant as disclosed in U.S. Pat. No. 3,458,311, Example 1. The modification comprises adding to the polyvinyl alcohol, in a ration of 5:1, a copolymer of vinylpyrrolidone and vinyl acetate (89/11); the viscosity of a 15% ethanol solution of this copolymer ranges between 38–44 centistokes at 75° F. (24° C.). In addition, to insure good wettability, the barrier layer contains a small amount of a surfactant of the following structure:

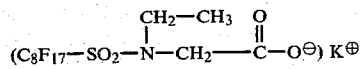

After removing the cover sheet, the removable oxygen-barrier layer remains on the photosensitive layer. The element is then exposed, through a process transparency, by the black light device of Example 1 for 30 seconds. An orange image of the original suitable for use as a photomask, was obtained on developing for 80 seconds at 68°–70° F. (20° C.), by immersion in a developer composition containing 2.33% sodium bicarbonate and 0.67% sodium carbonate in distilled water, followed by washing with water, scrubbing with a water-laden pad, then drying. The developer removes the oxygen-barrier layer and then the unexposed areas of the photopolymerizable layer. The following data show that as development is continued for longer periods of time, etching of the line image occurs:

DEVELOPMENT vs. LINE WIDTH

| Immersion Time (secs.) | Line Width (microns) |
|---|---|
| 40 | 124 (underdev.) |
| 45 | 124 |
| 50 | 119 |
| 55 | 117 |
| 60 | 111 |

Original line target = 124 microns clear space.

EXAMPLE 7

This example demonstrates the necessity of high optical densities in order to achieve dot-etchability. Four photopolymerizable compositions were prepared as described in Example 6. Composition A is identical with Example 6; Compositions B–D vary as follows:

| Component | Composition Variations (grams) | | | |
|---|---|---|---|---|
| | A | B | C | D |
| $CH_2Cl_2$ | 363.0 | 340.8 | 318.0 | 279.3 |
| $CH_3OH$ | 41.0 | 37.9 | 35.3 | 31.0 |
| Michler's ketone | 2.2 | 1.65 | 1.1 | 0.55 |
| Dye | 25.0 | 20.0 | 15.0 | 6.25 |
| Optical Density 300–500 nm | 4 | 3 | 2 | 1 |

After exposure, as in Example 6, to a target containing 125 micron lines, the decrease in line widths with increasing development was measured, using the developer and process of Example 6. The following data were obtained.

| Development Time (sec.) | Line Widths ($\mu$) | | | |
|---|---|---|---|---|
| | A | B | C | D |
| 40 | 118 | 120 | 117 | 120 |
| 45 | 114 | 119 | 118 | 120 |
| 50 | 112 | 114 | 112 | 120 |
| 55 | 109 | — | 117 | 120 |
| 60 | 108 | 112 | — | 120 |

The results indicate that Composition A (Ex. 6), with an O.D. of 4 over 300 to 500 nm, is dot (line) etchable in a regular pattern. Composition B (O.D. of 3), is also dot-etchable, but less readily so. Composition C (O.D. of 2) gave somewhat erratic results, but is obviously substantially not dot-etchable. Composition D (O.D. of 1) is clearly stabilized, presumably polymerized, down to the base, and thus not etchable (undercut) at all.

EXAMPLE 8

Part A

This example illustrates a photopolymerizable, aqueously developable, contact-speed, lithographic system containing a pigment. The following coating dispersion, 10% solids in methylene chloride, was prepared:

| Component | % Solids |
|---|---|
| (a) Binder (c) of Example 4 | 16.4 |
| (b) Binder (d) of Example 4 | 30.3 |
| (c) Photoinitiator (e) of Example 4 | 5.8 |
| (d) Photoinitiator (f) of Example 4 | 2.3 |
| (e) Surfactant (k) of Example 4 | 0.09 |
| (f) Monomer (h) of Example 1 | 27.2 |
| (g) Plasticizer (g) of Example 1 | 1.7 |
| (h) Colloidal carbon | 16.4 |

In preparing the above coating formulation, components (b) through (g) are dissolved directly in the solvent. Components (a) and (h) are mixed separately in $CH_2Cl_2$, sand milled to obtain a small particle size, then the other components are added to this dispersion. Many carbon blacks can be used; furnace black, particle size ca. 75 nm was used in this example. The well-mixed coating composition was coated on the substrate of Example 3 to yield a layer with a dry thickness of 0.0002 inch (0.005 mm) having an optical density of greater than 3.0 in the 300 to 500 nm region, and laminated with the cover sheet of Example 1. The element was then exposed, through a halftone target, by a BRH lamp (1000-watt, tungsten-iodide), for 30 seconds, the lamp was at a distance of 1 meter from the photopolymerizable layer. After removal of the cover sheet, a black image was obtained by developing the film for 45 seconds at room temperature with an aqueous developer containing 2% each of $Na_2CO_3$ and $NaHCO_3$, followed by a water rinse and drying. Further, the positive halftone dots obtained were dot-etched by swabbing the film in the same developer for 30 seconds. Thus, this film provides a suitable lithographic-type element for preparing further copies.

Part B

Elements, similar to that described in Part A, were used to illustrate dot-etching as performed in the printing trade. A positive image master (mask) was made with the elements for each of the four standard colors (magenta, cyan, yellow and black) normally used to prepare plates for printing a color picture. These elements were exposed using the device in Example 8 and developed in an automatic processor described in Example 3 with the developer solution described in Examples 9–11 to provide four dot-etchable masks. A full color proof on color proofing film (as described in U.S. Pat. No. 3,649,268) was made from these masks to simulate a press print. On analyzing the proof it was observed that there was too much yellow in all parts of the picture and that one area appears "too red". To correct these problems the yellow positive image should be "flat etched" (all the dots in the picture reduced a small percentage in size) and the magenta positive image should be "locally etched" (the dots in the too-red areas reduced a substantial percentage in size).

To accomplish this, copies were made of the yellow and magenta masters using the same exposure and development techniques (the positive image masters were copied to negative imagwe intermediates which were then copied to positive image duplicates of the originals). The resulting yellow duplicate was then rerun through the processor with twice the normal development time. This served to dot-etch all the dots on the image. Examples of the amount of reduction in the size (coverage) of various dots (150 line screen) are:

| Dot size in Orig. Mask | Dot size in Etched Mask |
|---|---|
| 98.3% | 92.1% |
| 55.4 | 35.0 |
| 11.0 | 2.3 |

Measurements of the change in surface area of the dots under magnification were compared to the change in integrated density for a given area. These measurements confirmed that the change in integrated density was totally a result of the change in dot area and not a loss of density within the dot.

The magenta positive image duplicate was then locally etched. The area to be etched was visually ascertained, and the rest of the image was protected by painting with a "staging solution" containing:

| | |
|---|---|
| $CCl_2FCClF_2$ | 240 g |
| Poly(n-butylmethacrylate) | 15 g |

Inherent viscosity=0.53 in a solution containing 0.25 g polymer in 50 ml. $CHCl_3$ measured at 20° C. using a No. 50 Cannon-Fenske viscometer.

| | |
|---|---|
| Tris-(4-diethylamino-o-tolyl)methane | 0.5 g |
| C.I. Solvent Blue 36 | 0.3 g |

When the stage had dried, the designated area was etched by immersing the whole film in a solution of 65% Butyl Carbitol®, 17.5% ethylene glycol and 17.5% water, by volume, for 10-20 seconds and then rinsed with an impact water spray. The dot size was measured and the process was repeated until the proper size dot was achieved. In this instance, the reduction was from 40% dots to 10% dots and again there was no loss in density within the dot when tested by comparing integrated density and dot size. The film was dried by hot air and the stage was removed by carefully wiping with solvent ($CCl_2FCClF_2$) and then dried.

Another full color proof was made from the master cyan and black masks and the etched yellow and magenta masks, which confirmed that the required color shift had been accomplished. Thus, these masks may be employed for exposing photopolymerizable printing plates which, in turn, would give a full color press print with the correct color balance.

EXAMPLES 9-11

The following examples are similar to Example 8, but illustrate the use of multiple monomers and alternative photoinitators. The following photopolymerizable coating compositions, about 15% solids in $CH_2Cl_2$, were prepared:

| Component | Amount (grams) | | |
|---|---|---|---|
| | Ex. 9 | Ex. 10 | Ex. 11 |
| (a) Binder (c) of Example 4 | 20.0 | 10.8 | 10.8 |
| (b) Binder (d) of Example 4 | 38.7 | 19.0 | 19.0 |
| (c) Photoinitiator (e) of Example 4 | 11.4 | — | — |
| (d) Photoinitiator (f) of Example 4 | 2.8 | — | — |
| (e) Surfactant (k) of Example 4 | 0.5 | 1.0 | 1.0 |
| (f) Monomer (h) of Example 1 | 2.3 | 2.0 | 2.0 |
| (g) Colloidal carbon | 16.4 | 7.2 | 7.2 |
| (h) Monomer (h) of Example 4 | 22.1 | 9.8 | 9.8 |
| (i) Phenanthrenequinone | — | 1.5 | — |
| (j) Benzoin methyl ether | — | — | 1.5 |

As in Example 8, the carbon and binder (a) were finely dispersed by milling, and the other components added to this dispersion. Then, the well-mixed coating compositions were coated separately on the substrate of Example 3, and laminated with the cover sheet of Example 1. The dried coating thickness of Example 9 was ca. 0.004 mm, and of Examples 10-11 ca. 0.0076 mm. The Example 9 film had a visible optical density of 3.0, and 4.0 in the region 300 to 500 nm; the films of Examples 10-11 had optical densities 4.0 in both the visible and UV regions of the spectrum.

The Example 9 film was exposed for 20 seconds as in Example 8, but with the radiation source 152.5 cm from the sample. The films of Examples 10-11 were exposed for 10 minutes to a xenon lamp using the device described in Example 4. Then, upon removal of the cover sheet, the film of Example 9 was developed in the automatic processor of Example 3, 5 seconds, 27° C., using as developer a solution of $NaHCO_3$ (4.6 g) and $Na_2CO_3.H_2O$ (27.4 g) in water (1 liter), followed by a water spray rinse and drying. The resulting film image was an accurate reproduction of the halftone target; the "hard" dots exhibited sharp edges, and were dot-etchable.

The film of Examples 10-11 were developed in a tray (15 seconds, 24° C.) in an aqueous solution containing $Na_2CO_3$ (2%) and $NaHCO_3$ (1%). After a water rinse and drying, sections of the imaged films were selectively dot-etched producing a dot size reduction of approximately 5-10% using an aqueous solution containing $Na_2CO_3$ (0.4%) and $NaHCO_3$ (0.4%).

EXAMPLES 12-13

The following two examples, also similar to Example 8, illustrate alternative binders useful in the invention. Coating compositions containing the following components, in $CH_2Cl_2$/2-ethoxy-ethanol, were prepared:

| Component | Amount (% of Solids) | |
|---|---|---|
| | Ex. 12 | Ex. 13 |
| (a) Binder (c) of Example 4 | 46.7 | — |
| (b) Photoinitiator (e) of Example 4 | 7.5 | 7.5 |
| (c) Photoinitiator (f) of Example 4 | 2.1 | 2.5 |
| (d) Surfactant (k) of Example 4 | 0.1 | 0.1 |
| (e) Monomer (h) of Example 4 | 20.0 | 26.0 |
| (f) Colloidal carbon | 18.0 | 17.6 |
| (g) Copolymer of methyl methacrylate (90%) and methacrylic acid (10%), mol. wt. ca. 50,000 | 5.2 | — |
| (h) High molecular weight tetrapolymer from methyl methacrylate (30%), butyl acrylate (25%), acrylonitrile (30%) and | — | 46.5 |

-continued

| Component | Amount (% of Solids) | |
|---|---|---|
| | Ex. 12 | Ex. 13 |
| methacrylic acid (15%) | | |

Following the milling, mixing, coating and lamination procedures and using the exposure device of Example 8, the two films were exposed for 15 and 10 seconds, respectively. The film of Example 12 had a thickness of 0.00025 inch (0.0063 mm) and O.D. >3, and that of Example 13 0.0002 inch (0.0051 mm) and O.D. >3. Following development as described in Example 10 (pH=10.3, 29° C., 10–15 seconds), the dried film halftone images were dot-etched. The etching solution was identical to the developer, but was diluted with 3 parts of water. The etching procedure involved protecting portions of the film with tape, then gently swabbing the unprotected area with a cotton pad soaked in etching solution (room temperature), followed by a water rinse and drying. Of course, this etching procedure could be repeated until the desired effect is achieved. As the following data indicate, both films are dot-etchable with no loss in top density (i.e., the density of the dots). The drop in the overall (visible) density of the elements indicates dot-etching (i.e., reduction in size of the dots of the image).

| | Optical Density (O.D. Units) | | | |
|---|---|---|---|---|
| | Top Density | | Overall Density, 50% Dots | |
| Ex. No. | Before Etching | After Etching | Before Etching | After Etching |
| 12 | 3.5 | 3.5 | 0.27 | 0.21 |
| 13 | 3.0 | 3.0 | 0.30 | 0.18 |

EXAMPLES 14–15

The following two examples, yielding useful orange photomasks similar to Example 4, illustrate the use of alternative dyes. The following coating compositions were prepared:

| | Amount (grams) | |
|---|---|---|
| Component of Example 4 | Ex. 14 | Ex. 15 |
| Solvent (a) | 81.0 | 81.0 |
| Solvent (b) | 9.0 | 9.0 |
| Binder (c) | 1.58 | 1.58 |
| Binder (d) | 2.62 | 2.62 |
| Photoinitiator (e) | 0.55 | 0.55 |
| Photoinitiator (f) | 0.22 | 0.22 |
| Chain transfer agent (g) | 0.08 | 0.08 |
| Monomer (h) | 1.26 | 1.26 |
| Surfactant (k) | 0.07 | 0.07 |
| Dye A* | 0.9 | 0.9 |
| Dye B* | 0.5 | — |
| Dye C* | 1.75 | 1.75 |
| Dye D* | — | 0.5 |

*Dyes A–D are all solvent soluble and are dicyclohexylamine salts of acid dyes. Dye A is solvent Red 30, C.I. 27291. Dye C is the salt of Tartrazine, C.I. 19140. Dye D is the salt of C.I. 19135. Dye B is the salt of the acid dye formed on diazotizing and coupling 2-amino-5-chloro-benzenesulfonic acid to 3-methyl-1-(2,5-dichloro-4-sulfophenyl)-pyrazolone.

The above coating solutions were coated, laminated and exposed as in Example 4. Dry coating weights were 118–125 mg/dm$^2$, ca. 0.0004 inch (0.010 mm) thick; both were exposed 3 minutes. Development, following removal of the cover sheet, employed an aqueous solution containing 2% sodium bicarbonate and 0.67% sodium carbonate, for 2 minutes, at 21° C. After rinsing with water and drying, the resulting orange image had an O.D. >4 in the region 300–500 nm.

EXAMPLE 16

Carbon-pigmented photopolymerizable layers are oxygen-sensitive and must be protected from oxygen of the air during exposure. This is frequently accomplished by use of a thin removable film, which is laminated to the surface of the photopolymer layer. It can also be accomplished by overcoating the photopolymer layer with a solution of an oxygen barrier polymer, which adheres to the photopolymer layer (after evaporation of its solvent), gives good oxygen protection, and is removable in the developer solvent. An example of such an overcoat solution is given below.

| | |
|---|---|
| Water | 1240.0 g |
| Polyvinyl alcohol (98–99% saponified, low viscosity) | 200.0 g |
| Copolymer of vinyl pyrrolidone/vinyl acetate (60/40, medium mol. wt.) | 24.4 g |
| Ethyl Cellosolve | 24.6 g |
| Polyoxyethylene surfactant of the formula: $C_8H_{17}\text{-}\phi\text{-}O(CH_2CH_2O)_{9\text{-}10}H$ | 2.3 g |
| Denatured alcohol | 17.3 g |

For use in coating a composition similar to Example 8, Part A, a solution containing 3.5% solids was prepared as follows:

| | |
|---|---|
| Water | 683.0 g |
| Overcoat solution above | 210.0 g |
| Surfactant above (10% aqueous solution) | 5.4 ml |
| Blue Pigment (Inmont Blue 3G) | 1.8 g |

This solution was coated on elements similar to that of Example 8, Part A, but without a cover film, using an extrusion die, the coating element was dried at 200° F. (93.3° C.). In three coatings, dried coating weights of 9.2, 15.0 and 24.1 mg/dm$^2$ were obtained. These three films were then compared to the control, a composition similar to Example 8, Part A (with a protective cover film). The two overcoated elements with lower coating weights exhibited lower photospeed than the control; furthermore, these two were rapidly affected by the atmosphere (the overcoat lost its gloss and cracks appeared). The element with the highest overcoat weight, however, exhibited good stability and with both photospeed and dot range equivalent to the control.

EXAMPLE 17

500 g of polyvinyl alcohol (98–98.8% saponified, now viscosity) were added to 5000 g of distilled water and heated at 85° C. for 2 hours. 100 g of the solution was mixed with 262 g distilled water, 18 g polyoxyethylene surfactant (10% aqueous solution) described in Example 16, 10 g ethyl Cellosolve, and 10 g ethyl alcohol. To 100 g of the above mixture was added 2.7 g of a 30% colloidal silica dispersion containing particle sizes in the range of 12 to 15 millimicrons and 30 g of distilled water. This resulted in an overcoat formulation in grams as follows:

| | |
|---|---|
| Polyvinyl alcohol | 2.25 |
| Distilled water | 122.50 |
| Polyoxyethylene surfactant | 0.45 |
| Ethyl cellosolve | 2.50 |
| Ethyl alcohol | 2.50 |
| Colloidal silica | 2.70 |

A photopolymer composition as described in Example 9 was used to prepare a photopolymerizable element also described in Example 9.

The cover sheet was removed. Using a 2-mil (0.05 mm) doctor knife, the above overcoat solution was coated directly on the photopolymerizable surface and allowed to dry. The coating weight of the overcoat was 10.0 mg/dm$^2$.

The overcoated element was exposed and developed as described in Example 9. It was found that the overcoated element and an element having a cover sheet as in Example 9 had substantially the same photospeed (within one $\sqrt[3]{2}$ step).

The following tests were conducted to determine retention of the overcoat:

A. GRAVIMETRIC

A sample of the overcoated film was given an overall imaging exposure (10 seconds). It was found that only 9.0 mg/dm$^2$ of overcoat could be dissolved off this sample (as opposed to 10.0 gm/dm$^2$ for unexposed film). This indicates that 10% of the overcoat remains in the exposed areas.

B. X-RAY FLUORESCENCE

The above gravimetric data are in good agreement with X-ray fluorescence analysis, which indicates that exposed and processed image areas retain 12% of the silica initially present in the raw-stock.

C. SCANNING ELECTRON MICROSCOPY (SEM)

Additional evidence for overcoat material remaining on exposed and processed film is given by scanning electron microscopy. SEM studies of films overcoated with polyvinyl alcohol based overcoats that contained 1–4% of 4 micron silica particles show that significant numbers of these particles remain on exposed and processed image surfaces.

EXAMPLE 18

Into a 3-gallon (11.36 liter) emulsion can is placed 4500 g of distilled water and 100 g of decationized gelatin, and the mixture is allowed to soak for 15 minutes at room temperature followed by heating to 125° to 130° F. (52° to 55° C.) for 30 minutes. The mixture is cooled to 95° to 100° F. (35° to 39° C.). The following components are added:

| Component | Amount |
|---|---|
| Ethanol | 50 g |
| Ethyl Cellosolve | 50 g |
| 10% Aqueous solution of the surfactant described in Example 16 | 50 ml |
| Methyl methacrylate (66%)/ethyl acrylate (29%); acrylic acid (5%) (30% solids in water), | 75.0 g |
| Mucochloric acid, 2% aqueous solution | 600.0 ml |

The above solution is coated on the surface of photopolymerizable layer of a photopolymerizable element described in Example 9 to a dry coating weight of 10 mg/dm$^2$. The gelatin layer is dried at 230° F. (110° C.).

Two samples of the coating, one square decimeter, are exposed, front and back sides for 1 minute each as described in Example 9, and the weights of the samples are recorded with the following results:

| Sample No. | Amount (grams) |
|---|---|
| 1 | 1.4347 |
| 2 | 1.4393 |

Sample 1 and 2 are processed as described in Example 9. After drying, the two samples are reweighed with the following results.

| Sample No. | 1 | 2 |
|---|---|---|
| Initial weight | 1.4347 | 1.4393 |
| Weight after processing | 1.4339 | 1.4386 |
| Weight loss | 0.0008 | 0.0007 |

The average weight loss is 0.75 mg/dm$^2$. This example illustrates that approximately 92.5% by weight hardened gelatin remains on the photopolymerized surface of a photopolymerizable element. The unexposed unpolymerized photopolymerizable layer and its gelatin overcoat are completely removed during processing.

EXAMPLE 19

This example illustrates preparing color-coded photomasks of this invention useful both as an alternative proofing system and for preparing printing plates for full color printing.

Three coating solutions were prepared, each containing the following ingredients:

| Component of Ex. 4 | Amount (grams) |
|---|---|
| Solvent (a) | 81.0 |
| Solvent (b) | 4.0 |
| Photoinitiator (e) | 1.0 |
| Photoinitiator (f) | 0.1 |
| Binder (c) | 4.1 |
| Binder (d) | 6.6 |
| Monomer (h) | 3.2 |
| Surfactant (k) | 0.04 |
| Ultraviolet absorber (2,2'-dihydroxy-4-methoxybenzophenone) | 1.0 |

To each individual solution was also added one of the following dyes:

| Dye | Amount (grams) |
|---|---|
| Grasol ® Fast Brill. Red RL (C.I. Solvent Red 86) | 1.0 |
| Irgacet ® Yellow 2RL (C.I. Solvent Yellow 91) | 1.0 |
| Ingacet ® Brill. Blue 2GLN (C.I. Solvent Blue 48) | 1.0 |

Each of the above three solutions was then coated, via a "doctor" knife, onto the substrate and subbing layer described in Example 3. After hot air drying, the dried coating weights were approximately 150 mg/dm$^2$, the dried coating thicknesses approximately 0.0004 inch (0.01 mm). Each photopolymerizable layer was then overcoated with a thin oxygen barrier polymer, substantially as described in Example 17. The resulting three elements of the invention all absorbed strongly throughout the 300 to 400 nm spectral range; the optical densities varied from 3.0-3.2. The maximum absorption in the visible portion of the spectrum occurred at 675 and 630 nm for the cyan film, at 560 and 450 nm for the magenta film, and at 470 nm for the yellow film.

Each colored element was then exposed as described in Example 4, but with a 90-second exposure to the halftone color separation negative corresponding to its color, i.e., magenta, yellow and cyan. Development (15 seconds) with an aqueous solution (pH 10.4) of potassium carbonate (1.5%) and potassium bicarbonate (1.5%) at 29° C., followed by rinsing in warm water (38° C.), and drying, gave a faithful image of the halftone targets, one in magenta, one in yellow, and one in cyan.

The cyan film was dot-etched by soaking the imaged film in the developer described above (30 seconds, 29° C.) followed by a spray with warm water at 38° C. After drying, measurement showed a dot size reduction of a 50% dot to a 45% dot, without any loss of density within a dot. In a similar manner, the yellow and magenta films can be dot-etched.

We claim:

1. A high contrast, dot-etchable solvent-processable lithographic film element comprising a support bearing a very thin actinic radiation photopolymerizable layer no more than 0.010 mm thick and having an optical density of at least 3.0 to the actinic radiation, the photopolymerizable layer comprised of an ethylenically unsaturated compound capable of forming a high polymer by free radical initiated, chain propagating, addition polymerization, an organic polymeric binder, a free radical generating addition polymerization initiator system activatable by actinic radiation in the spectral region of 300 nm or above, and optionally containing an actinic radiation absorber, the photopolymerizable layer being the outermost layer of the element or being contiguous to a removable cover sheet or an overcoat layer which is at least partially soluble in or permeable to a developer solvent for the photopolymerizable layer.

2. An element according to claim 1 wherein the layer has an optical density of at least 3.0 in the 300 to 500 nm region.

3. An element according to claim 1 wherein the photopolymerizable layer is no more than 0.008 mm thick.

4. An element according to claim 1 wherein the layer has an optical density of at least 4.0 in the 350 to 400 nm region.

5. An element according to claim 1 wherein the photopolymerizable layer is contiguous to a removable cover sheet or overcoat layer.

6. An element according to claim 1 wherein the photopolymerizable layer is the sole photopolymerizable layer in the element.

7. An element according to claim 1 wherein the support comprises a sheet bearing a nonphotosensitive sub layer between the sheet and the photopolymerizable layer, the sub layer being soluble in a developer solvent for the photopolymerizable layer, the combined thickness of the sub layer and photopolymerizable layer being no more than 0.015 mm.

8. An element according to claim 1 wherein the photopolymerizable layer contains a colorant taken from the group of black, yellow, magenta and cyan.

9. An element according to claim 1 wherein the support is a polymeric film.

10. An element according to claim 6 wherein the support comprises a sheet bearing a nonphotosensitive sub layer between the sheet and the photopolymerizable layer, the sub layer being soluble in a developer solvent for the photopolymerizable layer, the combined thickness of the sub layer and photopolymerizable layer being no more than 0.015 mm.

11. An element according to claim 10 wherein the photopolymerizable layer has an optical density of at least 4.0 throughout the 350 to 400 nm region.

12. An element according to claim 1 wherein the photopolymerizable layer comprises an organic free-radical generating addition polymerization initiator system activatable by actinic radiation present in an amount of 0.1 to 25%, an actinic radiation absorber present in an amount of 0 to 40%, an ethylenically unsaturated compound present in an amount of 7.5 to 35%, and an organic polymeric binder present in an amount of 10 to 75%, the percentages being by weight of the photopolymerizable layer.

13. An element according to claim 1 wherein the photopolymerizable layer is developable in predominantly aqueous developer solvents.

14. An element according to claim 5 wherein the overcoat layer is transparent to actinic radiation.

15. An element according to claim 9 wherein the polymeric film support is transparent to actinic radiation.

16. An element according to claim 1 wherein the polymeric binder comprises at least one vinyl addition polymer containing free carboxylic acid groups.

17. An element according to claim 1 wherein after imagewise exposure to actinic radiation and solvent development the nonimage areas have an optical density not exceeding 0.3 in the 350 to 400 nm region.

18. An element according to claim 1 containing a dispersed pigment in the photopolymerizable layer.

19. An element according to claim 10 containing a dispersed pigment wherein after imagewise exposure to actinic radiation and solvent development the nonimage areas have an optical density not exceeding 0.3 in the 350 to 400 nm region.

20. An element according to claim 18 wherein the dispersed pigment is carbon black.

21. An element according to claim 12 wherein the actinic radiation absorber compound is a dye and/or pigment in an amount of 15 to 40% by weight of the photopolymerizable layer.

22. An element according to claim 14 wherein the overcoat layer contains a matting agent.

23. An element according to claim 22 wherein the matting agent is taken from the group of colloidal silica, corn starch, rice starch, and mixtures thereof.

24. An element according to claim 1 wherein the element is substantially transparent in at least a portion of the visible region of the spectrum.

25. An element according to claim 24 wherein the photopolymerizable layer transmits light in the magenta, cyan or yellow regions of the visible spectrum.

* * * * *